US 6,664,857 B2

(12) United States Patent
Ausserlechner

(10) Patent No.: US 6,664,857 B2
(45) Date of Patent: Dec. 16, 2003

(54) TWO-STAGE OPERATIONAL AMPLIFIER

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/364,817

(22) Filed: Feb. 11, 2003

(65) Prior Publication Data

US 2003/0146792 A1 Aug. 7, 2003

Related U.S. Application Data

(63) Continuation of application No. PCT/DE01/03038, filed on Aug. 9, 2001.

(30) Foreign Application Priority Data

Aug. 11, 2000 (DE) .......................... 100 39 438

(51) Int. Cl.⁷ .............................. H03F 3/04; H03F 3/45
(52) U.S. Cl. .................... 330/297; 330/257; 330/261
(58) Field of Search ................. 330/257, 261, 330/297

(56) References Cited

U.S. PATENT DOCUMENTS

| 3,988,691 A | | 10/1976 | Shih |
| 4,249,137 A | * | 2/1981 | Malchow ................ 330/283 |
| 4,335,360 A | | 6/1982 | Hoover |
| 4,357,579 A | | 11/1982 | Kato et al. |
| 4,570,128 A | * | 2/1986 | Monticelli ............... 330/267 |
| 4,998,029 A | * | 3/1991 | Sundstrom ............... 326/78 |
| 5,654,671 A | | 8/1997 | Murray |
| 5,892,893 A | * | 4/1999 | Hanf et al. ............... 714/3 |

FOREIGN PATENT DOCUMENTS

| FR | 2 572 604 A1 | 5/1986 |
| JP | 11 088 070 A | 3/1999 |

OTHER PUBLICATIONS

U. Tietze et al.: "Electronic Circuits Designs and Applications", 9$^{th}$ ed., Springer Verlag, Berlin, *1991*, pp. 484–489.
R. Hogervorst et al.: Low–Voltage Low–Power CMOS Operational Amplifier Cells, *Cluver Academic Publishers, Boston*, p. 151.

* cited by examiner

*Primary Examiner*—Patricia Nguyen
(74) *Attorney, Agent, or Firm*—Laurence A. Greenberg; Werner H. Stemer; Ralph E. Locher

(57) ABSTRACT

A two-stage operational amplifier has an input stage and a downstream output stage. In this configuration, the magnitude of a first supply potential which supplies the input stage and is provided by a device for voltage reduction is smaller than that of a second supply potential which supplies the output stage. With a small chip area, as a result of predominantly being able to use standard MOS components, and with a low power requirement, high output voltages are possible at the output of the operational amplifier.

10 Claims, 4 Drawing Sheets

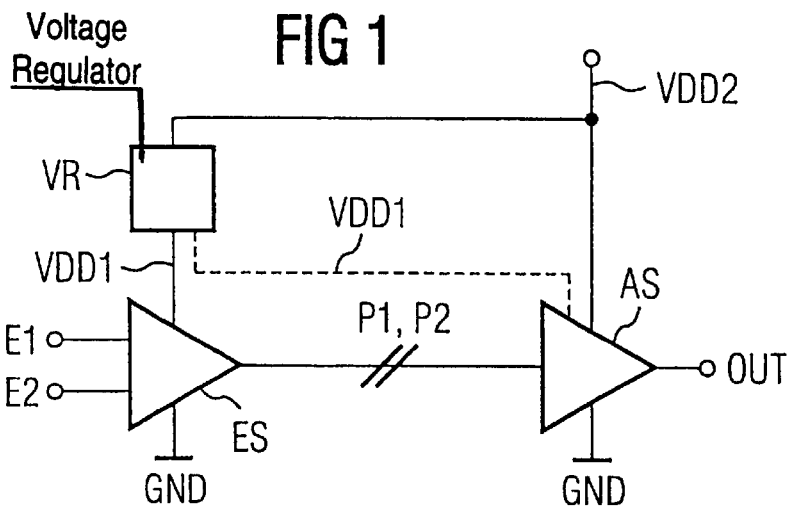
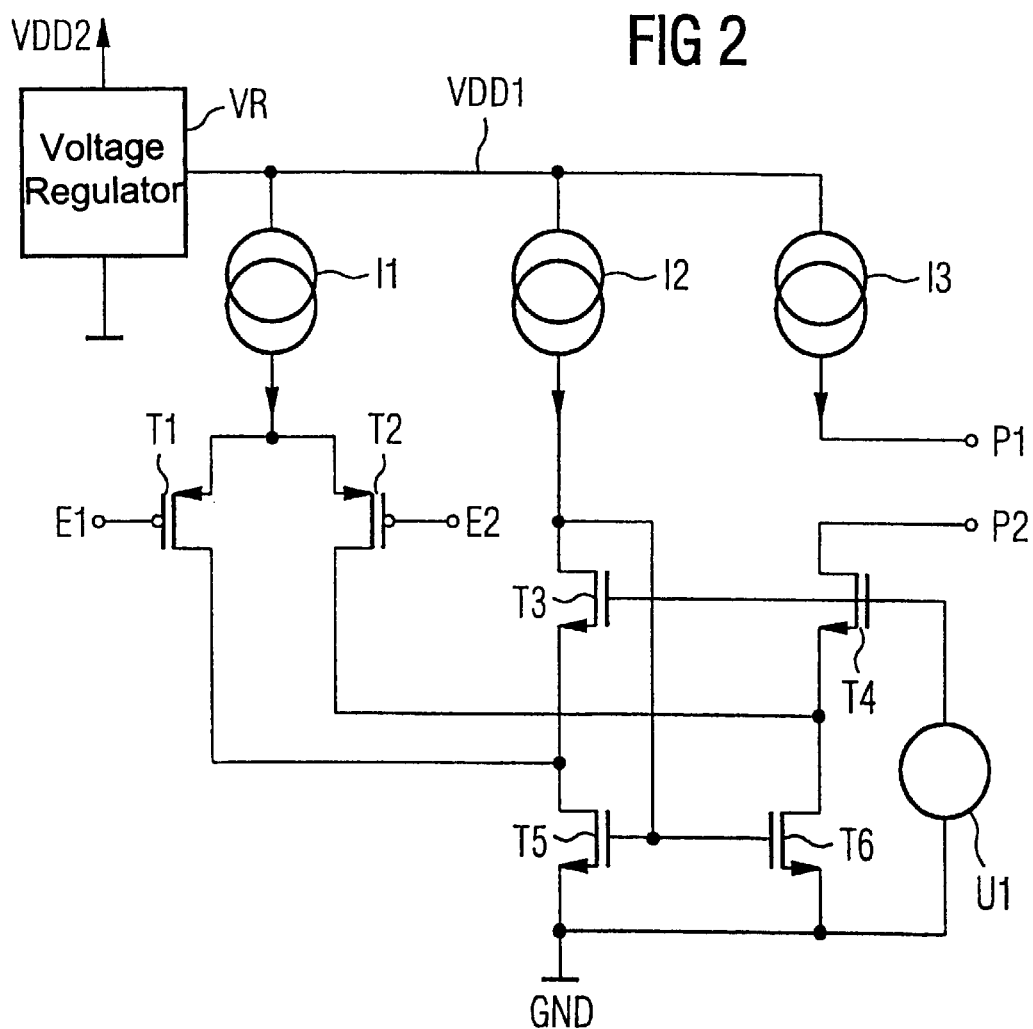

TWO-STAGE OPERATIONAL AMPLIFIER

CROSS-REFERENCE TO RELATED APPLICATION

This application is a continuation of copending International Application No. PCT/DE01/03038, filed Aug. 9, 2001, which designated the United States and was not published in English.

BACKGROUND OF THE INVENTION

Field of the Invention

The invention relates to a two-stage operational amplifier having an input stage whose input can be supplied with a signal that is to be amplified and whose output provides a first amplified signal. The amplifier further has an output stage whose input side is connected to the output of the input stage and at whose output a second amplified signal can be derived.

A configuration of the generic type is specified in Japanese Patent Abstract JP 11088070 A, for example. This document specifies an amplifier circuit having an input stage supplied by a first supply voltage and a downstream output stage supplied by a second supply voltage, where the second supply voltage is higher than the first supply voltage.

The printed document by Tietze, Schenk, titled "Halbleiter-Schaltungstechnik [Semiconductor Circuitry]", $9^{th}$ edition 1990, pages 542–546 specifies integrated voltage regulators for providing a stabilized DC voltage.

Standard CMOS technology normally features a low withstand voltage within specified limits. For higher voltages, such as can arise on application specific integrated circuit (ASIC) interfaces, high-voltage CMOS technology is suitable, by way of example, but a feature of this is an increased chip area requirement, and also it cannot be integrated in a conventional standard CMOS production process without additional complexity.

There is also high-voltage bipolar transistor technology. However, an operational amplifier constructed entirely or predominantly from high-voltage bipolar transistors has a large area requirement, a low phase reserve on account of the high parasitic capacitances of high-voltage bipolar transistors, a large amplifier offset, caused by the relatively low current gain, and a relatively poor power supply rejection ratio (PSRR), which is likewise caused by the high parasitic capacitances.

Another two-stage operational amplifier of the generic type, in the form of a class AB rail-to-rail operational amplifier, is specified, by way of example, in the reference titled "Design of Low-Voltage, Low-Power Operational Amplifier Cells", by Ron Hogervorst et al., Cluver Academic Publishers, Boston, on page 151.

SUMMARY OF THE INVENTION

It is accordingly an object of the invention to provide a two-stage operational amplifier which overcomes the above-mentioned disadvantages of the prior art devices of this general type, which is suitable for high output voltages and has a good PSRR response.

With the foregoing and other objects in view there is provided, in accordance with the invention, a two-stage operational amplifier. The amplifier contains an input stage having an input for receiving a signal to be amplified and an output providing a first amplified signal, an output stage having an input side connected to the output of the input stage and an output providing a second amplified signal, and a voltage regulator having an output connected to the input stage and supplying the input stage with a first supply potential. The voltage regulator further has an input connected to the output stage and supplies the output stage with a second supply potential. The output stage has at least one output transistor and a quiescent-current setting circuit provided for the output transistor. The quiescent-current setting circuit is connected to the output of the voltage regulator and receives the first supply potential.

The object is achieved with a two-stage operational amplifier as cited in the introduction in which the device for voltage reduction, in the form of a voltage regulator, is provided. The voltage regulator has an output connected to the input stage in order to supply the latter with a first supply potential and whose input is connected to the output stage and supplies a second supply potential. The output stage has a quiescent-current setting circuit for at least one output transistor in the output stage, the quiescent-current setting circuit being connected to the first supply potential in order to receive a voltage.

The operational amplifier can have more than two stages.

The magnitude of the first supply potential supplying the input stage is smaller than that of the second supply potential supplying the output stage.

The supply of voltage to the output stage being a higher, second supply potential has the advantage that it is possible to combine various technologies, for example standard CMOS technology and high-voltage bipolar technology, within one operational amplifier. A two-stage operational amplifier developed in this manner can largely be constructed using standard MOS transistors, can be produced using relatively little chip area and with a good PSRR response, and is suitable for high output voltages.

To improve the operational amplifier further, inter alia with regard to power consumption and area requirement, not only the input stage and the quiescent-current setting circuit for at least one output transistor in the output stage but also other circuit parts in the output stage can be supplied with the lower, first supply potential.

To derive the lower, first supply potential from the higher, second supply potential, the device for voltage reduction can be in the form of an internal voltage regulation circuit which can be optimized in terms of the PSRR and the first supply potential's voltage stabilization, so that, in the event of the occurrence of interference pulses at the level of the second supply potential, only negligibly small disturbances are overcoupled onto lines carrying the first supply potential, and again only a small portion of these disturbances spreads to the input stage of the two-stage operational amplifier.

Whereas the second supply potential can be situated in a range from −18 V to +25 V, the first supply potential derived therefrom, whose magnitude is smaller than that of the second supply potential, is +3 volts, for example. In many applications-specific integrated circuits (ASICs), such a low internal chip supply voltage of, for example, +3 volts, which is an improvement in terms of PSSR and voltage stabilization, is already present anyway for the signal-processing CMOS circuit parts of the ASIC, which results in that the two-stage operational amplifier described can be produced with the least possible complexity while providing effective suppression of disturbances related to the supply of power.

In one preferred embodiment of the invention, the input stage features a differential amplifier, to which the signal to be amplified can be supplied, and a convoluted cascode circuit connected downstream of the differential amplifier. Since the cascode circuit is provided in the input stage of the two-stage operational amplifier, which input stage can be operated at the lower, first supply potential, the cascode circuit can be produced with a small chip area, with low parasitic capacitances and with a higher PSRR. The cascode circuit described also allows low input signal potentials to be processed and allows PMOS transistors to be used. The signal that can be tapped off on the output side of the cascode circuit is simultaneously the input signal for the output stage of the two-stage operational amplifier.

In another advantageous embodiment of the present invention, the output stage features a respective quiescent-current setting circuit which is provided for a respective output transistor, among which a first output transistor is connected to the second supply potential and a second output transistor is connected to a reference-ground potential. The quiescent-current setting described for the output stage of the two-stage operational amplifier allows a reduction of transfer distortions in the second amplified signal that can be derived on the output side of the output stage. In addition, the quiescent-current setting can ensure the stability of any desired output voltages and of load resistors of any desired value in applications in which the operational amplifier is operated using feedback networks.

In another advantageous embodiment of the present invention, the quiescent-current setting circuit for the second output transistor is connected to the first supply potential in order to supply it with voltage. Although the output stage is operated by the higher, second supply potential, the quiescent-current setting circuit for the second output transistor can be supplied with the lower, first supply potential, which results in that the quiescent-current setting circuit for the second output transistor can be produced using little chip area and standard NMOS components.

In another advantageous embodiment of the present invention, the quiescent-current setting circuit for the first output transistor is connected to the first supply potential in order to supply it with voltage. In this case, the description already given for the quiescent-current setting circuit for the second output transistor applies to the quiescent-current setting circuit for the first output transistor; the result is likewise a quiescent-current setting circuit which can be produced with little chip area requirement and using standard PMOS components.

In another preferred embodiment of the present invention, bipolar transistors are provided which are connected first to the quiescent-current setting circuit for the first output transistor and second to the second supply potential. As an alternative to supplying the quiescent-current setting circuit for the output transistor with the first supply potential, it can be supplied with the second supply potential using bipolar transistors which are connected between the quiescent-current setting circuit for the first output transistor and the second, higher supply potential. In this case, the bipolar transistors form a virtual potential, corresponding to the first, low supply potential, at their connecting nodes in the quiescent-current setting circuit for the first output transistor. As a result of this, the quiescent-current setting circuit for the first output transistor can also be produced with standard PMOS components having the above-mentioned advantages. In this configuration, the bipolar transistors protect the PMOS transistors from the higher voltage. To this end, the base connections of the bipolar transistors can be connected to a suitable potential. In this case, the bipolar transistors form a translinear loop with the MOS transistors in the quiescent-current setting circuit for the purpose of setting quiescent current. The amplifier configuration is suitable for operation using a particularly low first supply potential.

In another advantageous embodiment of the present invention, to generate a base potential for the bipolar transistors in the quiescent-current setting circuit, a circuit section is provided which is connected to the base connections of the bipolar transistors. Using the first and/or second supply potential, further transistors can easily be used to form a base potential on the bipolar transistors in a quiescent-current setting circuit, which base potential protects the quiescent-current setting circuit from the high, second supply potential.

In another advantageous embodiment of the present invention, to actuate the output transistors, a respective current-mirror transistor is connected to a respective output transistor so as to form a respective current mirror, the current mirrors being able to be supplied with the first amplified signal in order to actuate them. In this case, the current mirrors allow independent setting of a mirror ratio that can differ for the first and second output transistors.

In another advantageous embodiment of the present invention, to actuate the two current mirrors, a respective driver transistor is connected to a respective current-mirror transistor, the input side of the driver transistors being connected to the output of the input stage. The driver transistors can be standard MOS transistors. Together with a respective quiescent-current setting circuit and a respective output transistor, a respective driver transistor forms a mixed translinear loop with the aim of subjecting the high-impedance outputs of the input stage to as little capacitance or resistance as possible. This improves the phase reserve and the linear gain of the two-stage operational amplifier, and the systematic offset is reduced.

In another advantageous embodiment of the present invention, the driver transistors are MOS transistors, preferably standard MOS transistors, and the current-mirror and output transistors are bipolar transistors, preferably bipolar transistors having a high withstand voltage.

Other features which are considered as characteristic for the invention are set forth in the appended claims.

Although the invention is illustrated and described herein as embodied in a two-stage operational amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of an input stage and an output stage for illustrating the principles according to the invention;

FIG. 2 is a circuit diagram of an exemplary embodiment of the input stage of an operational amplifier;

DESCRIPTION OF THE PREFERRED EMBODIMENTS

Figure 3:
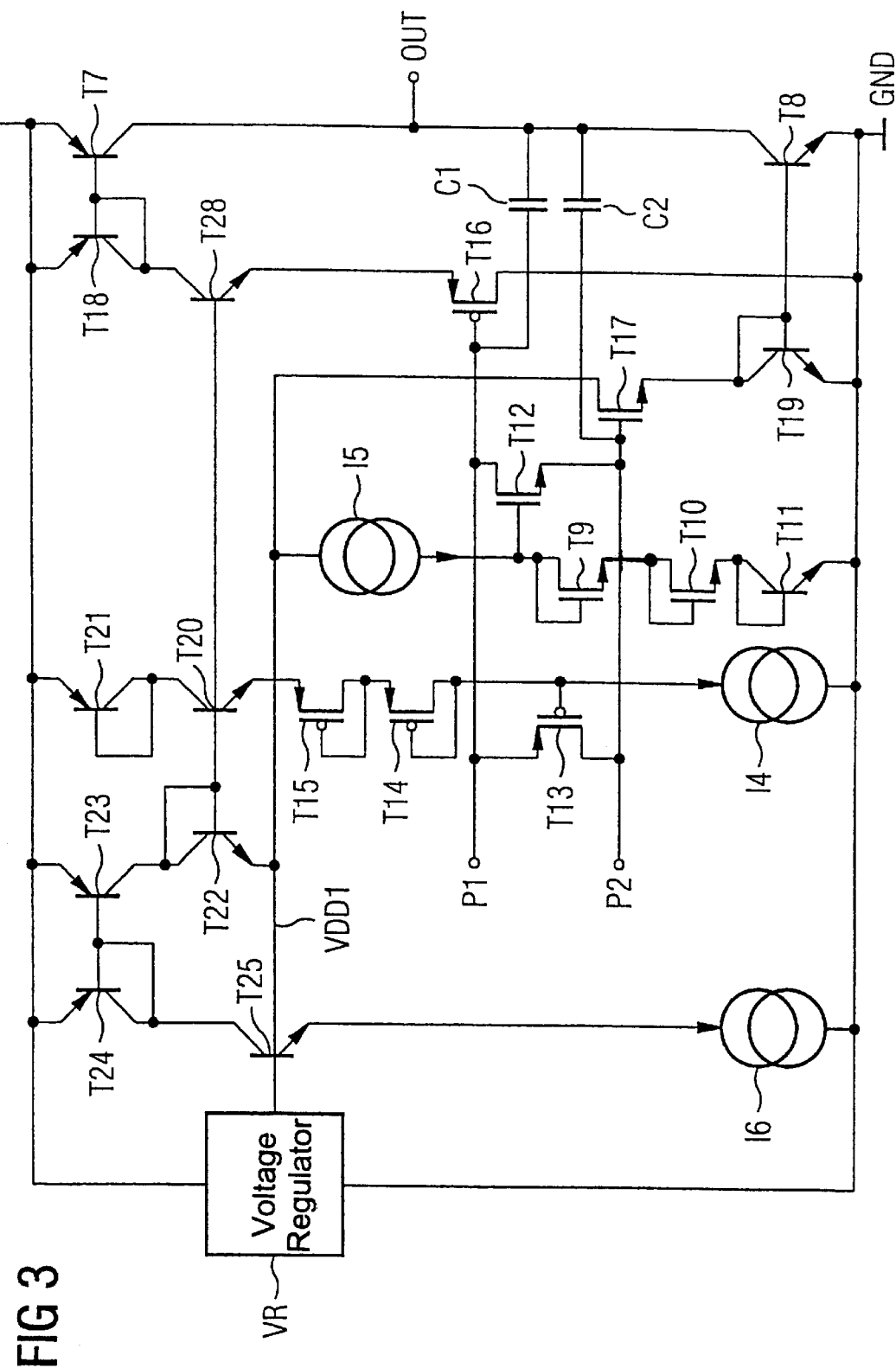
FIG. 3 is a circuit diagram of a first exemplary embodiment of the output stage of the operational amplifier.

Referring now to the figures of the drawing in detail and first, particularly, to FIG. 1 thereof, there is shown a two-stage operational amplifier having an input stage ES whose input E1, E2 can be supplied with a signal which is to be amplified, for example in the form of a symmetrical signal, and whose output P1, P2 provides a first amplified signal. The signal can be supplied to the input of an output stage AS in the two-stage operational amplifier, with a second amplified signal being able to be derived at an output OUT of the output stage AS. All in all, the inputs E1, E2 form the inverting and non-inverting inputs of the operational amplifier, and the output OUT is a single-ended output of the operational amplifier. Whereas the input stage ES is connected to a first supply potential connection, the output stage AS is connected to a second supply potential connection. In this configuration, a magnitude of the first supply potential VDD1 is smaller than that of the second supply potential VDD2. To derive the first supply potential VDD1 from the second supply potential VDD2, a device for voltage reduction is provided which is in the form of a voltage regulator VR. The second supply voltage, which is formed between the second supply potential VDD2 and the reference-ground potential GND, can be situated in a range from −18 V to +25 V. By contrast, the first supply potential VDD1 is much lower in terms of its magnitude, and is +3 V, for example. Since the two-stage operational amplifier is not supplied entirely by the high voltage required for an output signal which can be set in a wide voltage range, but rather only subregions of the output stage AS of the two-stage operational amplifier are supplied by a high supply potential, and the input stage ES is supplied by a low supply potential, the two-stage operational amplifier can be produced using little chip area, with a high output voltage and with a high power supply rejection ratio (PSRR).

FIG. 2 shows one possible circuit implementation of the input stage ES from FIG. 1. To supply the input stage ES, it is connected to a first supply potential connection for supplying the first supply potential VDD1 and to a reference-ground potential GND. Using the voltage regulator VR, the first supply potential VDD1 can be derived from the higher, second supply potential VDD2. The signal to be amplified, which can be supplied at the input E1, E2 and can be a differential symmetrical signal, can be supplied to the gate connections of a differential amplifier, formed from two PMOS transistors T1, T2. A bias current required for operating the differential amplifier, T1, T2 is provided by a current source I1. Connected to the output side of the differential amplifier T1, T2 is a convoluted cascode circuit that contains four MOS transistors T3, T4, T5, T6. On an output side of the cascode circuit T3, T4, T5, T6, a first amplified signal can be tapped off at an output P2, with an output P1 of the input stage additionally being formed with a third current source I3. The cascode circuit T3 to T6 is connected to the first supply potential VDD1 via a second current source I2. Specifically, the cascode circuit has two respective transistors T3, T4; T5, T6 whose gate connections are connected to one another, the controlled paths of two respective transistors T3, T5; T4, T6 being connected to one another and having the output of the differential amplifier T1, T2 connected to them. Between the control connections of a first transistor pair T3, T4 and the reference-ground potential GND, there is additionally a first voltage source U1. The interconnected gate connections of the second transistor pair T5, T6 are connected directly to the second current source I2. The cascode circuit also allows low input signal potentials to be processed.

Since the input stage ES is supplied by the lower, first supply potential VDD1, it can be produced using standard CMOS components and with high accuracy so as to save area and power. In particular, its PSRR can be improved.

FIG. 3 shows a first exemplary embodiment of the output stage AS from FIG. 1. To provide a supply for it, it is connected to the second supply potential VDD2 and to the reference-ground potential GND. The input of the output stage AS can be connected to the output P1, P2 of the input stage. At the output OUT of the output stage AS, it is possible to derive the second amplified signal.

To produce a class AB amplifier configuration, FIG. 3 features a respective quiescent-current setting circuit for a respective output transistor T7, T8 in the output stage. To actuate the output transistors T7, T8, a respective current-mirror transistor T18, T19 is used to form a current mirror. The current mirrors are actuated using driver transistors T16, T17 whose respective control input can be supplied with the first amplified signal derived from the input stage. In addition, a respective compensation capacitor Cl, C2 is connected between the control inputs of the driver transistors T16, T17 and the output OUT. Finally, a respective quiescent-current setting circuit is connected to the control inputs of the driver transistors T16, T17.

The low-side, second output transistor T8 obtains its quiescent-current setting using a current source I5, which is connected to the first supply potential VDD1 and to diode transistors T9, T10, T11 and, via a further transistor T12, to the input of the driver transistor T17. Since the current-mirror transistor T19 is connected as a bipolar diode, the pole point at the input of the current mirror T19, T8 is at very high frequencies, which means that a high phase reserve is ensured. The driver transistor T17, in the form of an NMOS transistor, whose gate is connected to the output P2 of the input stage, loads this output of the input stage only with a relatively low capacitance.

The output transistor T7, which is disposed on the high side and forms a current mirror together with the current-mirror transistor T18 connected as a bipolar diode, obtains its quiescent-current setting from the current source I4, which is connected to the reference-ground potential GND and to a PMOS transistor T13 which is connected to the driver transistor T16. In addition, the current source I4 is connected to a virtual first reference-ground potential via two PMOS transistors T14, T15 connected as diodes. In this configuration, the virtual reference-ground potential is set using two bipolar transistors T20, T28, first via the diode transistors T14, T15 and also on the load side of the driver transistor T16. In this case, the collector of the bipolar transistor T20 is connected to the second, higher supply potential via a transistor T21 connected as a bipolar diode, which means that the collector potential on the transistor T20 is as close as possible to that on the transistor T28. In this configuration, the virtual supply potential, which is at the level of the first supply potential, is set using a current-mirror transistor T22 whose base connection is connected first to bipolar transistor T20 and second to bipolar transistor T28, whose emitter is connected to the first supply potential VDD1 and whose collector is connected via a further current mirror T23, T24 to a current source I6 which is connected to the reference-ground potential GND, and using a further bipolar transistor T25, which is controlled by the first supply potential VDD1.

Not only the current source I4 but also the bipolar transistor T20 and the bipolar transistor T28 and also the MOS transistors T16, T13, T14 and T15, which together form a translinear loop, contribute to the quiescent-current setting by the pnp output transistor T7.

By virtue of the virtual first supply potential being formed on the bipolar transistors T20, T28, these transistors protect the MOS components which have a lower potential rating than them from high voltage. The PMOS driver transistor T16, like the NMOS driver transistor T17, loads the high-impedance output P1, P2 of the input stage from FIG. 2 only to a very small extent. The current sources I4, I5 and I6 can be formed using standard MOS transistors, since the bipolar transistors, particularly T20 and T25, protect the current sources from high voltage.

The bipolar transistor diode T21 is used primarily to provide the output stage with security against polarity reversal for the second supply potential VDD2, and can be dispensed with in alternative embodiments. In order to ensure that the output stage works as desired, the second supply potential VDD2 needs to be higher than the first supply potential VDD1 plus the base/emitter voltage of the bipolar transistor T22 plus the collector/emitter voltage of the bipolar transistor T23.

The output stage shown in FIG. 3 can be produced using a small number of more area-intensive bipolar transistors, since a large portion of the circuit is constructed using standard MOS components which are supplied by the low, first supply potential VDD1 or by the virtual supply potential.

Figure 4:
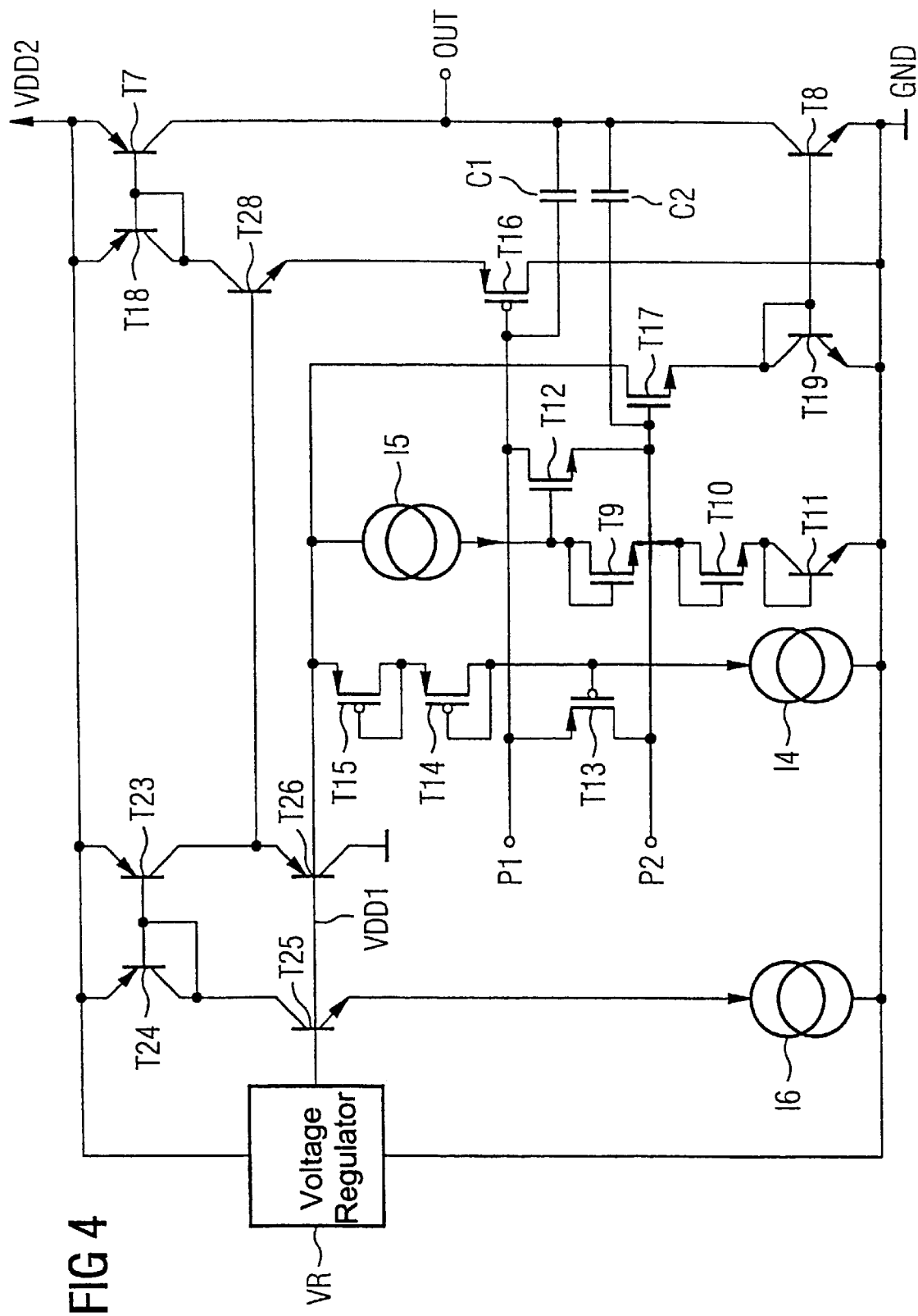
FIG. 4 is a circuit diagram of a second exemplary embodiment of the output stage of the operational amplifier.

FIG. 4 shows an alternative embodiment of the circuit arrangement shown in FIG. 3. In this circuit configuration, however, the number of bipolar transistors used has been reduced even further by replacing the current mirror T20, T22 and the bipolar transistor diode T21 from FIG. 3 with a bipolar transistor T26 whose base connection is connected to the first supply potential VDD1, whose emitter connection is connected first to the output of the current mirror T23, T24 and second to the control input of the bipolar transistor T28, and whose collector connection is connected to the reference-ground potential GND. In this configuration, the current source I4 in the quiescent-current setting circuit for the output transistor T7 is connected directly to the first supply potential VDD1, not to the virtual supply potential, via the diodes T14, T15 in the form of PMOS transistors. As compared with the output stage shown in FIG. 3, this makes it possible to attain a better PSRR and a further saving effect in terms of chip area, power consumption and circuit complexity.

Figure 5:
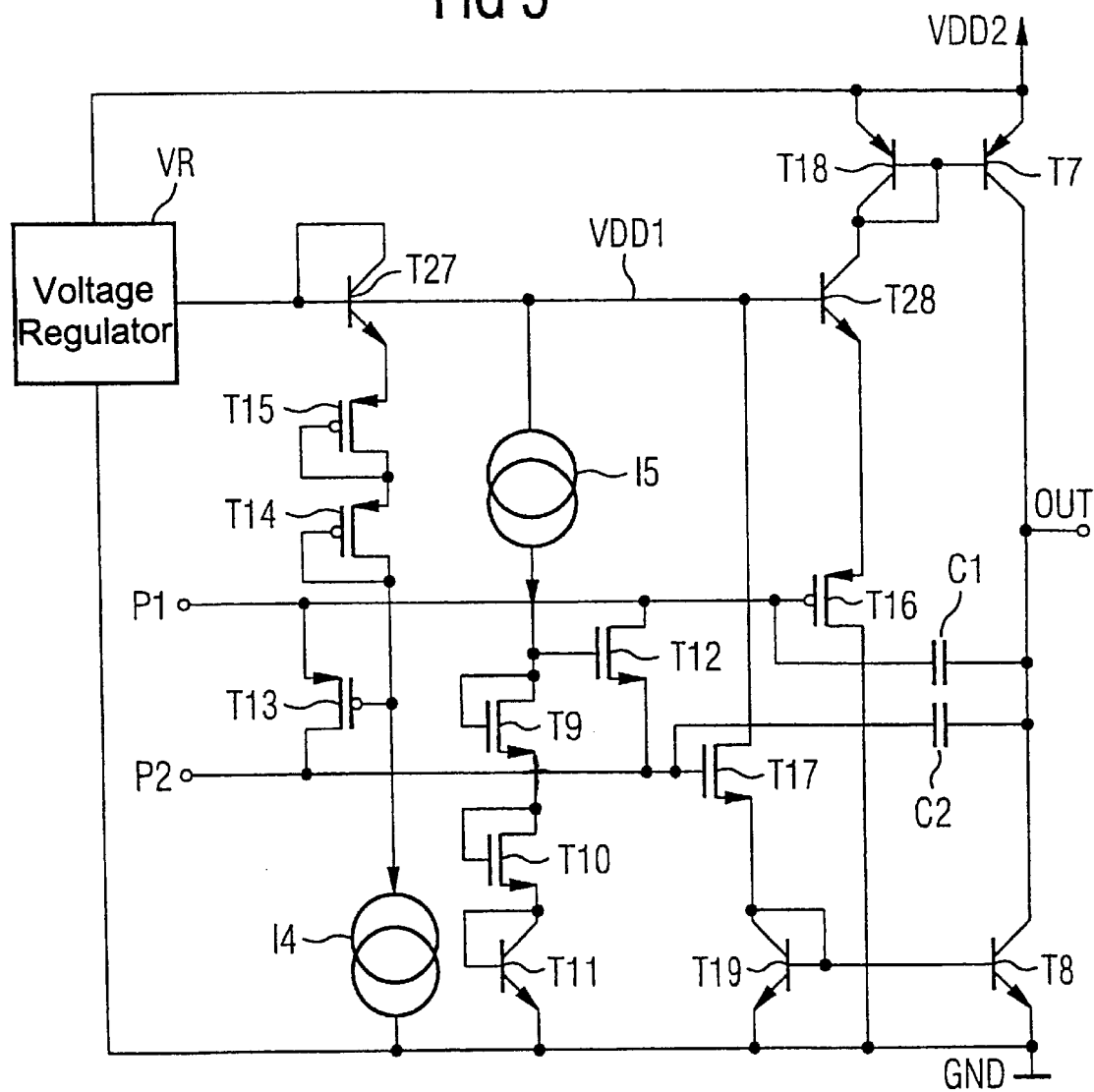
FIG. 5 is a circuit diagram of a third exemplary embodiment of the output stage of the operational amplifier.

Finally, FIG. 5 shows a third exemplary embodiment of a circuit implementation of the output stage AS from FIG. 1. In this case, formation of the virtual supply potential has been dispensed with entirely, so that, as compared with the implementation from FIG. 3, the current source I6 and the bipolar transistors T20, T21, T22, T23, T24 and T25 can be dispensed with. The translinear loop for setting the quiescent current for the pnp output transistor T7 is formed by the additional bipolar transistor T27 and by the MOS transistors T13, T14, T15, T16 and bipolar transistor T28. In this case, the bipolar transistor T27 is connected as a diode and its base and collector are connected to the first supply potential VDD1 and its emitter is connected to the current source I4 via the diode transistors T14, T15. Whereas the quiescent-current setting circuit for the npn output transistor T8 has remained unchanged as compared with FIGS. 3 and 4, the control input of the bipolar transistor T28, which forms a current mirror with transistor T22 in FIG. 3, is connected directly to the first supply potential VDD1 in the circuit shown in FIG. 5. The third embodiment described for the output stage AS of the two-stage operational amplifier allows a further reduction in the necessary chip area and in the power consumption of the two-stage operational amplifier on account of the further reduction in the number of bipolar transistors required which need to be suitable for operation at the higher, second supply potential VDD2. The described omission of the virtual supply potential also results in an additionally improved PSRR.

The embodiments described are distinguished by low parasitic capacitances, low systematic offset and low area requirement.

In alternative embodiments of the circuit, the few bipolar transistors used, which all have high withstand voltages, can be replaced with high-voltage cmos transistors.

I claim:

1. A two-stage operational amplifier, comprising:
    an input stage having an input for receiving a signal to be amplified and an output providing a first amplified signal;
    an output stage having an input side connected to said output of said input stage and an output providing a second amplified signal; and
    a voltage regulator having an output connected to said input stage and supplying said input stage with a first supply potential and an input connected to said output stage and supplying said output stage with a second supply potential;
    said output stage having at least one output transistor and a quiescent-current setting circuit provided for said output transistor, said quiescent-current setting circuit connected to said output of said voltage regulator and receiving the first supply potential.

2. The operational amplifier according to claim 1, wherein said input stage has a differential amplifier receiving the signal to be amplified, and a cascode circuit connected downstream of said differential amplifier.

3. The operational amplifier according to claim 1, wherein:
    said output stage has a reference ground terminal supplying a reference ground potential;
    said output stage has a further output transistor connected to said reference ground terminal;
    said output stage has a further quiescent-current setting circuit for said further output transistor; and
    said output transistor connected to said voltage regulator and receives the second supply potential.

4. The operational amplifier according to claim 3, wherein said further quiescent-current setting circuit for said further output transistor is connected to said output of said voltage regulator and receives the first supply potential.

5. The operational amplifier according to claim 3, wherein said quiescent-current setting circuit for said output transistor is connected to said output of said voltage regulator and receives the first supply potential.

6. The operational amplifier according to claim 3, wherein said output stage contains bipolar transistors connected first to said quiescent-current setting circuit for said output transistor and second to said voltage regulator for receiving the second supply potential, said bipolar transistors having base connections.

7. The operational amplifier according to claim 6, wherein said output stage contains a circuit section connected to said base connections of said bipolar transistors and generating a base potential for said bipolar transistors.

8. The operational amplifier according to claim 3, wherein said output stage contains, for actuating said output transistor and said further output transistors: two current-mirror transistors, including a first current-mirror transistor connected to said output transistor and a second current-mirror transistor connected to said further output transistor for forming first and second current mirrors, respectively, said current mirrors actuated by the first amplified signal.

9. The operational amplifier according to claim 8, wherein said output stage, for actuating said first and second current mirrors, contains:

driver transistors, including a first driver transistor coupled to said first current-mirror transistor and a second driver transistor connected to said second current-mirror transistor, said driver transistors each having an input side connected to said output of said input stage.

10. The operational amplifier according to claim 9, wherein:

said driver transistors are MOS transistors;

said two current-mirror transistors are bipolar transistors;

said output transistor is a bipolar transistor; and said further output transistor is a bipolar transistor.

* * * * *